(12) United States Patent
Ikeda

(10) Patent No.: US 12,283,583 B2
(45) Date of Patent: Apr. 22, 2025

(54) DISPLAY DEVICE INCLUDING PLURALITY OF LIGHT-EMITTING ELEMENTS WITH DIFFERENT EMISSION WAVELENGTH VARIATIONS

(71) Applicant: Japan Display Inc., Tokyo (JP)

(72) Inventor: Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 404 days.

(21) Appl. No.: 17/841,043

(22) Filed: Jun. 15, 2022

(65) Prior Publication Data

US 2022/0399320 A1 Dec. 15, 2022

(30) Foreign Application Priority Data

Jun. 15, 2021 (JP) .............................. JP2021-099692

(51) Int. Cl.
*H01L 25/16* (2023.01)
*H01L 33/62* (2010.01)

(52) U.S. Cl.
CPC ............ *H01L 25/167* (2013.01); *H01L 33/62* (2013.01)

(58) Field of Classification Search
CPC . H01L 25/0753; H01L 25/115; H01L 25/167; H01L 27/153; H01L 27/156; H01L 33/36; H01L 33/62; H01L 33/644; G09G 3/2003; G09G 3/32; G09G 3/3233; G09G 2300/0426; G09G 2300/0452; G09G 2300/0819; G09G 2300/0852; G09G 2300/0861; G09G 2380/00
See application file for complete search history.

(56) References Cited

U.S. PATENT DOCUMENTS 10,453,828 B1 10/2019 Ouderkirk et al.
2022/0157230 A1 5/2022 Suzuki

FOREIGN PATENT DOCUMENTS

WO WO2020/202766 A1 10/2020

*Primary Examiner* — Cheung Lee
(74) *Attorney, Agent, or Firm* — K&L Gates LLP

(57) ABSTRACT

A display device includes a substrate, a plurality of pixels provided to the substrate, a plurality of mounting electrodes and a plurality of light-emitting elements provided to the pixels, a first region provided at a center part of a display region of the substrate, and a second region provided closer to an outer end of the substrate than the first region in the display region of the substrate. Number of the mounting electrodes included in each of the pixels in the first region is equal to number of the mounting electrodes included in each of the pixels in the second region, and number of the light-emitting elements included in each of the pixels in the first region is larger than number of the light-emitting elements included in each of the pixels in the second region.

10 Claims, 9 Drawing Sheets

FIG.5

(TABLE 1)

| TYPE OF LIGHT-EMITTING ELEMENT | DIFFERENCE IN PEAK EMISSION WAVELENGTH OF FIRST LIGHT-EMITTING ELEMENT | DIFFERENCE IN PEAK EMISSION WAVELENGTH OF SECOND LIGHT-EMITTING ELEMENT | DIFFERENCE IN PEAK EMISSION WAVELENGTH OF FIRST LIGHT-EMITTING ELEMENT AND SECOND LIGHT-EMITTING ELEMENT |
|---|---|---|---|
| Red | $|\Delta\lambda(3R\text{-}1)| \leq 2.5\,nm$ | $|\Delta\lambda(3R\text{-}2)| \leq 2.5\,nm$ | $|\Delta\lambda(3R\text{-}12)| \leq 3.5\,nm$ |
| Green | $|\Delta\lambda(3G\text{-}1)| \leq 2.0\,nm$ | $|\Delta\lambda(3G\text{-}2)| \leq 2.0\,nm$ | $|\Delta\lambda(3G\text{-}12)| \leq 3.0\,nm$ |
| Blue | $|\Delta\lambda(3B\text{-}1)| \leq 3.5\,nm$ | $|\Delta\lambda(3B\text{-}2)| \leq 3.5\,nm$ | $|\Delta\lambda(3B\text{-}12)| \leq 5.0\,nm$ |

FIG.7

(TABLE 2)

| TYPE OF LIGHT-EMITTING ELEMENT | DIFFERENCE IN PEAK EMISSION WAVELENGTH OF FIRST REGION AND SECOND REGION | DIFFERENCE IN PEAK EMISSION WAVELENGTH OF SECOND REGION AND THIRD REGION | DIFFERENCE IN PEAK EMISSION WAVELENGTH OF FIRST REGION AND THIRD REGION |
|---|---|---|---|
| Red | $|\Delta\lambda(3R-13)| \leq 3.0nm$ | $|\Delta\lambda(3R-34)| \leq 3.0nm$ | $|\Delta\lambda(3R-14)| \leq 3.5nm$ |
| Green | $|\Delta\lambda(3G-13)| \leq 2.5nm$ | $|\Delta\lambda(3G-34)| \leq 2.5nm$ | $|\Delta\lambda(3G-14)| \leq 3.0nm$ |
| Blue | $|\Delta\lambda(3B-13)| \leq 4.0nm$ | $|\Delta\lambda(3B-34)| \leq 4.0nm$ | $|\Delta\lambda(3B-14)| \leq 5.0nm$ |

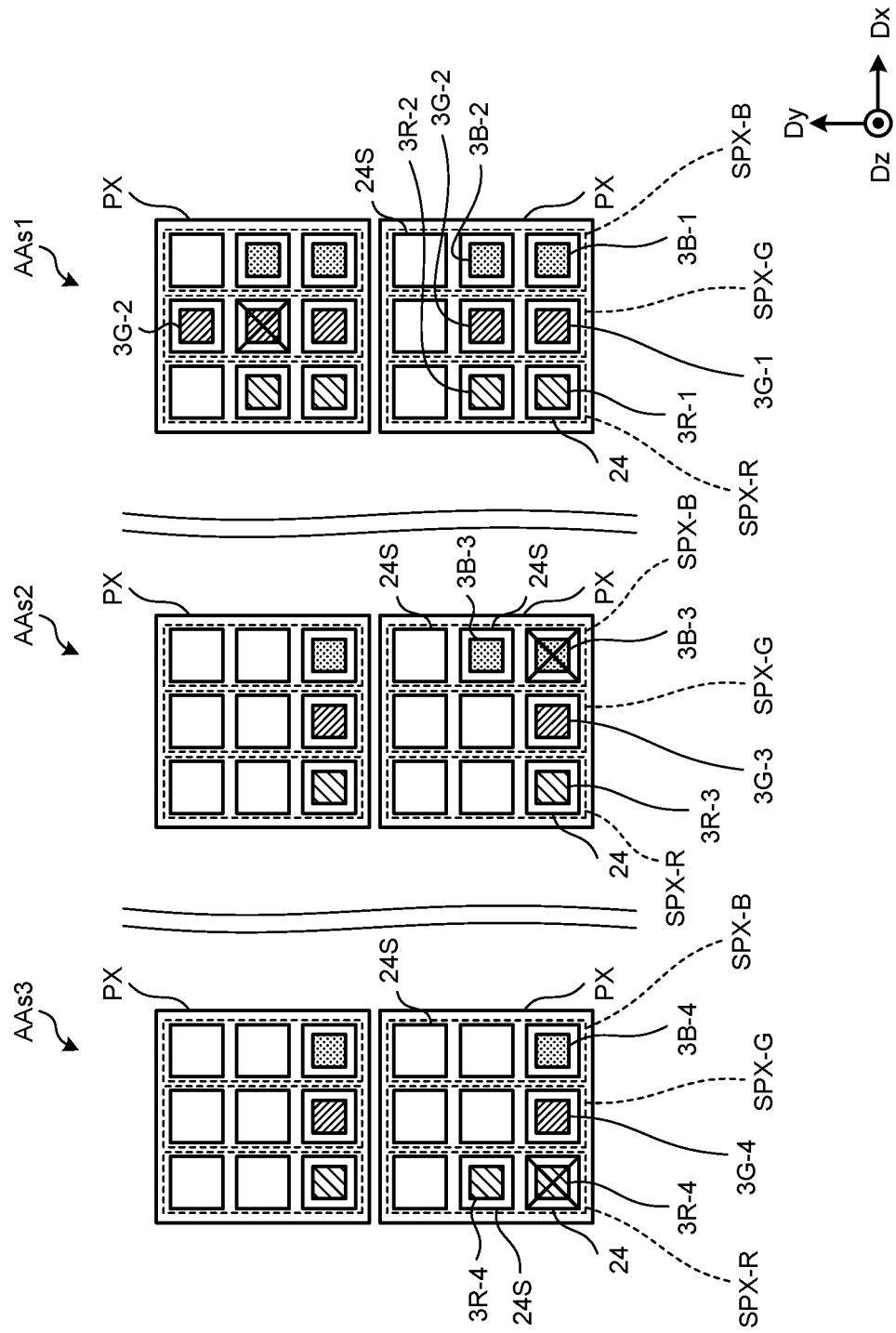

DISPLAY DEVICE INCLUDING PLURALITY OF LIGHT-EMITTING ELEMENTS WITH DIFFERENT EMISSION WAVELENGTH VARIATIONS

CROSS-REFERENCE TO RELATED APPLICATION

This application claims the benefit of priority from Japanese Patent Application No. 2021-099692 filed on Jun. 15, 2021, the entire contents of which are incorporated herein by reference.

BACKGROUND

1. Technical Field

The present disclosure relates to a display device.

2. Description of the Related Art

Display devices including micro-sized light-emitting diodes (micro-LEDs) as display elements have been attracting attention (refer to WO 2020-202766, for example). WO 2020-202766 describes a display device including a plurality of micro-LEDs having different emission colors and luminous efficiencies. The specification of U.S. patent Ser. No. 10/453,828 describes a display device used for a head-mounted display (HMD) that creates virtual reality (VR). The specification of U.S. patent Ser. No. 10/453,828 describes a technique for causing each region of the HMD to have different arrangement density of micro-LEDs.

In display devices for VR, an observer's sense of immersion is important. Therefore, color unevenness and definition in display are important factors near the center of the field of view. In other words, display devices for VR are required to have different display characteristics for each region and secure display redundancy. Patent Document 2 does not describe a specific configuration for causing each region to have different arrangement density of the micro-LEDs.

SUMMARY

A display device according to an embodiment of the present disclosure includes a substrate, a plurality of pixels provided to the substrate, a plurality of mounting electrodes and a plurality of light-emitting elements provided to the pixels, a first region provided at a center part of a display region of the substrate, and a second region provided closer to an outer end of the substrate than the first region in the display region of the substrate. Number of the mounting electrodes included in each of the pixels in the first region is equal to number of the mounting electrodes included in each of the pixels in the second region, and number of the light-emitting elements included in each of the pixels in the first region is larger than number of the light-emitting elements included in each of the pixels in the second region A display device according to an embodiment of the present disclosure includes a substrate, a plurality of pixels provided to the substrate, a first region provided at a center part of a display region of the substrate, and a second region provided closer to an outer end of the substrate than the first region in the display region of the substrate. Each of the pixels in the first region comprises a first light-emitting element and a second light-emitting element configured to output light in the same color as a color of light output from the first light-emitting element and having a peak emission wavelength different from a peak emission wavelength of the first light-emitting element, each of the pixels in the second region comprises a third light-emitting element configured to output light in the same color as the color of light output from the first light-emitting element and the second light-emitting element, and emission wavelength variation of a plurality of the first light-emitting elements is smaller than emission wavelength variation of a plurality of the third light-emitting elements.

BRIEF DESCRIPTION OF THE DRAWINGS

FIG. 5 is a table indicating the wavelength variation of first light-emitting elements and second light-emitting elements;

FIG. 7 is a table indicating the wavelength variation of the light-emitting elements among a first region, a second region, and a third region;

FIG. 8 is a view for explaining a method for repairing the display device according to the embodiment.

DETAILED DESCRIPTION

Figure 1:
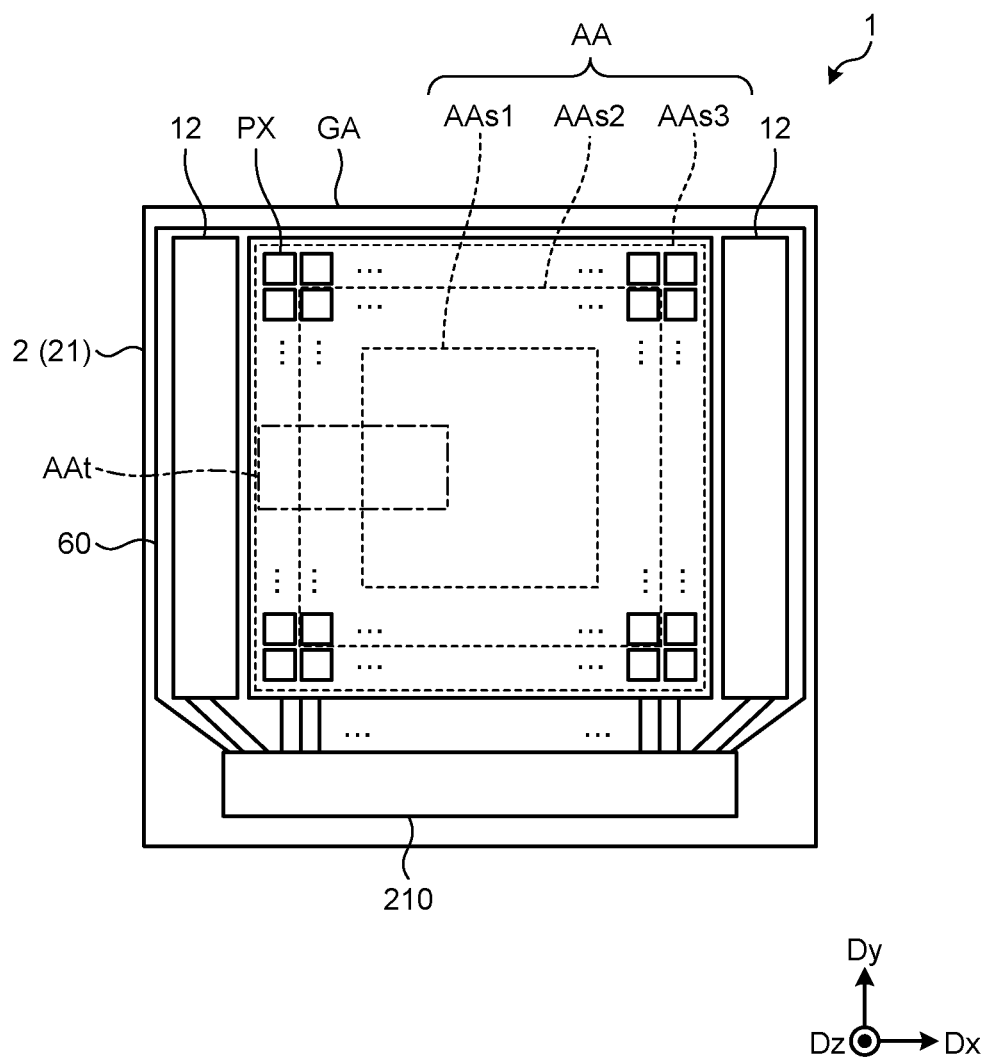
FIG. 1 is a plan view schematically illustrating a display device according to an embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

Embodiment

FIG. 1 is a plan view schematically illustrating a display device according to an embodiment. A display device 1 according to the present embodiment is a display device used for a head-mounted display (HMD) worn on the head of an observer to create virtual reality (VR), for example. The display device 1 is not limited to an HMD for displaying VR and may be an HMD for displaying images of augmented reality (AR) or mixed reality (MR), for example.

As illustrated in FIG. 1, the display device 1 includes an array substrate 2, pixels PX, drive circuits 12, a drive integrated circuit (IC) 210, and cathode wiring 60. The array substrate 2 is a drive circuit substrate that drives the pixels PX and is also called a backplane or an active matrix substrate. The array substrate 2 includes a substrate 21, a plurality of transistors, a plurality of capacitances, various kinds of wiring, and other components.

As illustrated in FIG. 1, the display device 1 has a display region AA and a peripheral region GA. The display region AA is a region overlapping the pixels PX and displays an image. The peripheral region GA is a region not overlapping the pixels PX and is positioned outside the display region AA.

The pixels PX are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation viewed from the third direction Dz.

In the display device 1 according to the embodiment, the display region AA includes a first region AAs1, a second region AAs2, and a third region AAs3. The first region AAs1 is a region positioned at the center of the display region AA and at the center of the field of view in the HMD for VR. The second region AAs2 is positioned closer to the outer end of the substrate 21 than the first region AAs1 and surrounds the first region AAs1. The third region AAs3 is positioned closer to the outer end of the substrate 21 than the second region AAs2 and surrounds the first region AAs1 and the second region AAs2. The third region AAs3 is a region positioned on the periphery of the display region AA.

In other words, the first region AAs1, the second region AAs2, and the third region AAs3 are arranged in this order from the center toward the outer end of the display region AA. The second region AAs2 and the third region AAs3 are each formed into an annular shape.

The position, the width, the area, and other elements of the first region AAs1, the second region AAs2, and the third region AAs3 illustrated in FIG. 1 are emphasized to facilitate reader's understanding. The first region AAs1, the second region AAs2, and the third region AAs3 can be appropriately modified depending on the display characteristics (e.g., definition and color unevenness) required for the display device 1. The second region AAs2 and the third region AAs3, for example, do not necessarily have an annular shape and may be formed along at least one side of the first region AAs1. While the pixels PX are illustrated in part of the display region AA in FIG. 1, they are arrayed in a matrix (row-column configuration) over the first region AAs1, the second region AAs2, and the third region AAs3.

The drive circuits 12 drive a plurality of gate lines (e.g., a reset control signal line L5, an output control signal line L6, a pixel control signal line L7, and an initialization control signal line L8 (refer to FIG. 3)) based on various control signals supplied via wiring extending from the drive IC 210. The drive circuits 12 sequentially or simultaneously select a plurality of gate lines and supply gate drive signals to the selected gate lines. As a result, the drive circuits 12 select the pixels PX coupled to the gate lines.

The drive IC 210 is a circuit that controls display on the display device 1. A plurality of wires extend from the drive IC 210 toward the pixels PX (e.g., a video signal line L2, a reset power supply line L3, and an initialization power supply line L4 (refer to FIG. 3)). The drive IC 210 is mounted on the peripheral region GA of the substrate 21 as chip on glass (COG). The mounting form of the drive IC 210 is not limited thereto, and the drive IC 210 may be mounted on a flexible printed circuit board or a rigid circuit board coupled to the peripheral region GA of the substrate 21.

The cathode wiring 60 is provided in the peripheral region GA of the substrate 21. The cathode wiring 60 is provided surrounding the pixels PX in the display region AA and the drive circuits 12 in the peripheral region GA. Cathodes of a plurality of light-emitting elements 3 are coupled to the common cathode wiring 60 and are supplied with a fixed potential (e.g., a ground potential). More specifically, a cathode electrode 32 (refer to FIG. 4) of the light-emitting element 3 is coupled to the cathode wiring 60 via a counter cathode electrode 22 (refer to FIG. 4) formed on the array substrate 2.

Figure 2:
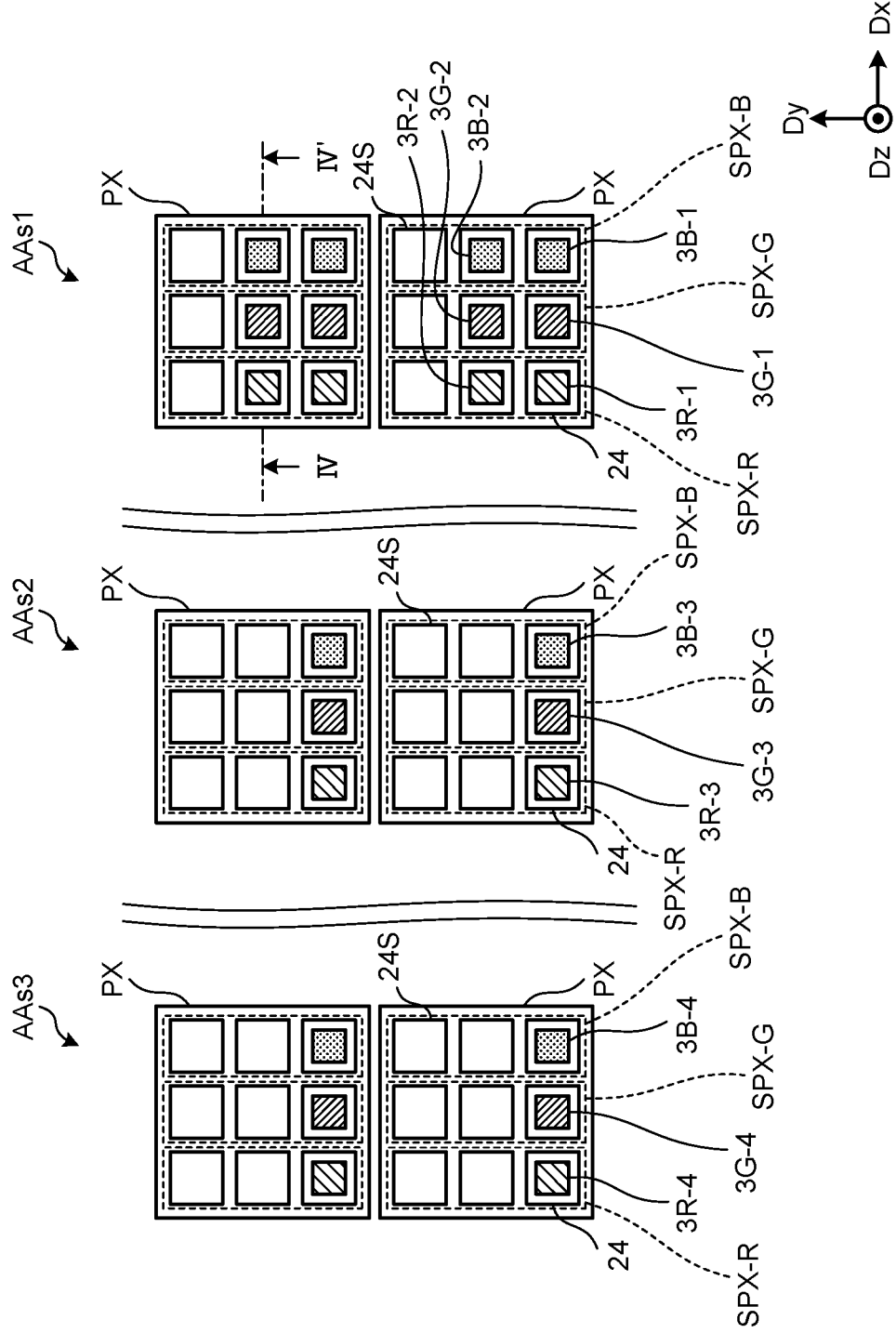
FIG. 2 is a plan view of a plurality of pixels.

FIG. 2 is a plan view of a plurality of pixels. FIG. 2 is an enlarged schematic of the pixels PX in the first region AAs1, the second region AAs2, and the third region AAs3 in a region AAt indicated by the alternate long and short dash line in FIG. 1. As illustrated in FIG. 2, one pixel PX includes a plurality of sub-pixels SPX. The pixel PX includes a sub-pixel SPX-R, a sub-pixel SPX-G, and a sub-pixel SPX-B, for example. The sub-pixel SPX-R displays a primary color of red as the first color. The sub-pixel SPX-G displays a primary color of green as the second color. The sub-pixel SPX-B displays a primary color of blue as the third color. As illustrated in FIG. 2, the sub-pixel SPX-R, the sub-pixel SPX-G, and the sub-pixel SPXB in one pixel PX are adjacently disposed in this order in the first direction Dx. The first color, the second color, and the third color are not limited to red, green, and blue, respectively, and may be any desired colors, such as complementary colors. In the following description, the sub-pixel SPX-R, the sub-pixel SPX-G, and the sub-pixel SPX-B are simply referred to as the sub-pixels SPX when they need not be distinguished from one another.

Each sub-pixel SPX includes the light-emitting element 3 and a mounting electrode 24. The display device 1 displays an image by causing the light-emitting elements 3R, 3G, and 3B in the sub-pixels SPX-R, SPX-G, and SPX-B, respectively, to output different lights. The light-emitting element 3 is an inorganic light-emitting diode (LED) chip having a size of approximately 3 μm to 300 μm in planar view and is called a micro-LED. The display device 1 including micro-LEDs in respective pixels is also called a micro-LED display device. The term "micro" of the micro-LED is not intended to limit the size of the light-emitting element 3.

The first region AAs1, the second region AAs2, and the third region AAs3 according to the present embodiment are different in the number, the arrangement density, and the characteristics (peak emission wavelength and emission wavelength variation) of the light-emitting elements 3. In the first region AAs1, the sub-pixel SPX-R includes three mounting electrodes 24, a first light-emitting element 3R−1, and a second light-emitting element 3R−2. The first light-emitting element 3R−1 and the second light-emitting element 3R-2 output light in the same color (red). The sub-pixel SPX-G includes three mounting electrodes 24, a first light-emitting element 3G-1, and a second light-emitting element 3G-2. The first light-emitting element 3G-1 and the second light-emitting element 3G-2 output light in the same color (green). The sub-pixel SPX-B includes three mounting electrodes 24, a first light-emitting element 3B-1, and a second light-emitting element 3B-2. The first light-emitting element 3B-1 and the second light-emitting element 3B-2 output light in the same color (blue). The first light-emitting elements 3R-1, 3G-1, and 3B-1 are adjacently disposed in this order in the first direction Dx. The second light-emitting elements 3R-2, 3G-2, and 3B-2 are adjacently disposed in this order in the first direction Dx and are disposed adjacently to the first light-emitting elements 3R-1, 3G-1, and 3B-1, respectively, in the second direction Dy.

In the first region AAs1, one pixel PX composed of three sub-pixels SPX includes nine mounting electrodes 24, three first light-emitting elements 3R-1, 3G-1, and 3B-1, and three second light-emitting elements 3R-2, 3G-2, and 3B-2. In one pixel PX, the mounting electrodes 24 are arrayed in a matrix (row-column configuration). Six mounting electrodes 24 out of the nine mounting electrodes 24 are provided with the light-emitting element 3, and three mounting electrodes 24 are not provided with the light-emitting element 3.

In the following description, the mounting electrode 24 not provided with the light-emitting element 3 out of the mounting electrodes 24 is referred to as a mounting electrode 24S. The first light-emitting elements 3R-1, 3G-1, and 3B-1 are simply referred to as first light-emitting elements 3-1 when they need not be distinguished from one another. The second light-emitting elements 3R-2, 3G-2, and 3B-2 are simply referred to as second light-emitting elements 3-2 when they need not be distinguished from one another. Third light-emitting elements 3R-3, 3G-3, and 3B-3 and fourth light-emitting elements 3R-4, 3G-4, and 3B-4 may also be referred to as third light-emitting elements 3-3 and fourth light-emitting elements 3-4, respectively.

In the second region AAs2, the sub-pixel SPX-R includes three mounting electrodes 24 and one third light-emitting element 3R-3. The sub-pixel SPX-G includes three mounting electrodes 24 and one third light-emitting element 3G-3. The sub-pixel SPX-B includes three mounting electrodes 24 and one third light-emitting element 3B-3. The third light-emitting elements 3R-3, 3G-3, and 3B-3 are adjacently disposed in this order in the first direction Dx. The third light-emitting elements 3R-3, 3G-3, and 3B-3 output light in the same color as that of the first light-emitting elements 3R-1, 3G-1, and 3B-1, respectively.

In the second region AAs2, one pixel PX composed of three sub-pixels SPX includes nine mounting electrodes 24 and three third light-emitting elements 3R-3, 3G-3, and 3B-3. In the second region AAs2, three mounting electrodes 24 out of the nine mounting electrodes 24 are provided with the third light-emitting element 3-3, and six mounting electrodes 24S are not provided with the light-emitting element 3.

In the third region AAs3, the sub-pixel SPX-R includes three mounting electrodes 24 and one fourth light-emitting element 3R-4. The sub-pixel SPX-G includes three mounting electrodes 24 and one fourth light-emitting element 3G-4. The sub-pixel SPX-B includes three mounting electrodes 24 and one fourth light-emitting element 3B-4. The fourth light-emitting elements 3R-4, 3G-4, and 3B-4 are adjacently disposed in this order in the first direction Dx.

The fourth light-emitting elements 3R-4, 3G-4, and 3B-4 output light in the same color as that of the first light-emitting elements 3R-1, 3G-1, and 3B-1, respectively.

In the third region AAs3, one pixel PX composed of three sub-pixels SPX includes nine mounting electrodes 24 and three fourth light-emitting elements 3R-4, 3G-4, and 3B-4. In the third region AAs3, three mounting electrodes 24 out of the nine mounting electrodes 24 are provided with the fourth light-emitting element 3-4, and six mounting electrodes 24S are not provided with the light-emitting element 3.

The third light-emitting elements 3-3 in the second region AAs2 and the fourth light-emitting elements 3-4 in the third region AAs3 have characteristics (emission wavelength variation) different from those of the first light-emitting elements 3-1 and the second light-emitting elements 3-2 in the first region AAs1. The emission wavelength variation of the light-emitting elements 3 will be described later with reference to FIGS. 5 to 7.

The number of mounting electrodes 24 included in one pixel PX is larger than the number of light-emitting elements 3 in the first region AAs1, the second region AAs2, and the third region AAs3. The mounting electrodes 24S not provided with the light-emitting element 3 are mounting electrodes for repair and are each provided with a pixel circuit PICA including various transistors. Repair of the light-emitting element 3 will be described later with reference to FIGS. 8 and 9.

In the pixels PX adjacently disposed in the second direction Dy in the first region AAs1, one mounting electrode 24S not provided with the light-emitting element 3 is disposed between the light-emitting element 3 of one of the pixels PX and the light-emitting element 3 of the other.

In the pixels PX adjacently disposed in the second direction Dy in the second region AAs2 and the third region AAs3, two mounting electrodes 24S not provided with the light-emitting element 3 are disposed between the light-emitting element 3 of one of the pixels PX and the light-emitting element 3 of the other.

As described above, the number of mounting electrodes 24 (e.g., nine) included in one pixel PX in the first region AAs1 is equal to the number of mounting electrodes 24 (e.g., nine) included in one pixel PX in the second region AAs2 and the third region AAs3. The number of light-emitting elements 3 (e.g., six) included one pixel PX in the first region AAs1 is larger than the number of light-emitting elements 3 (e.g., three) included in one pixel PX in the second region AAs2 and the third region AAs3.

As a result, the arrangement density of the light-emitting elements 3 is higher in the first region AAs1 positioned at the center of the observer's field of view than in the second region AAs2 and the third region AAs3 positioned closer to the outer end. In the example illustrated in FIG. 2, the arrangement pitch of the light-emitting elements 3 in the second direction Dy is smaller in the first region AAs1 than in the second region AAs2 and the third region AAs3. Therefore, the display device 1 can achieve high-definition display in the first region AAs1.

The configuration of the light-emitting element 3 will be described later in greater detail. The light-emitting elements 3 may output different lights in four or more colors. FIG. 2 is a diagram schematically illustrated to facilitate the reader's understanding, and the arrangement of the sub-pixels SPX in the pixel PX is not limited to the configuration illustrated in FIG. 2. The number of mounting electrodes 24 included in one pixel PX can be appropriately modified depending on the display characteristics (e.g., resolution)

required for the display device 1. The positions of the mounting electrodes 24 provided with the light-emitting element 3 in one pixel PX can also be appropriately modified.

Figure 3:
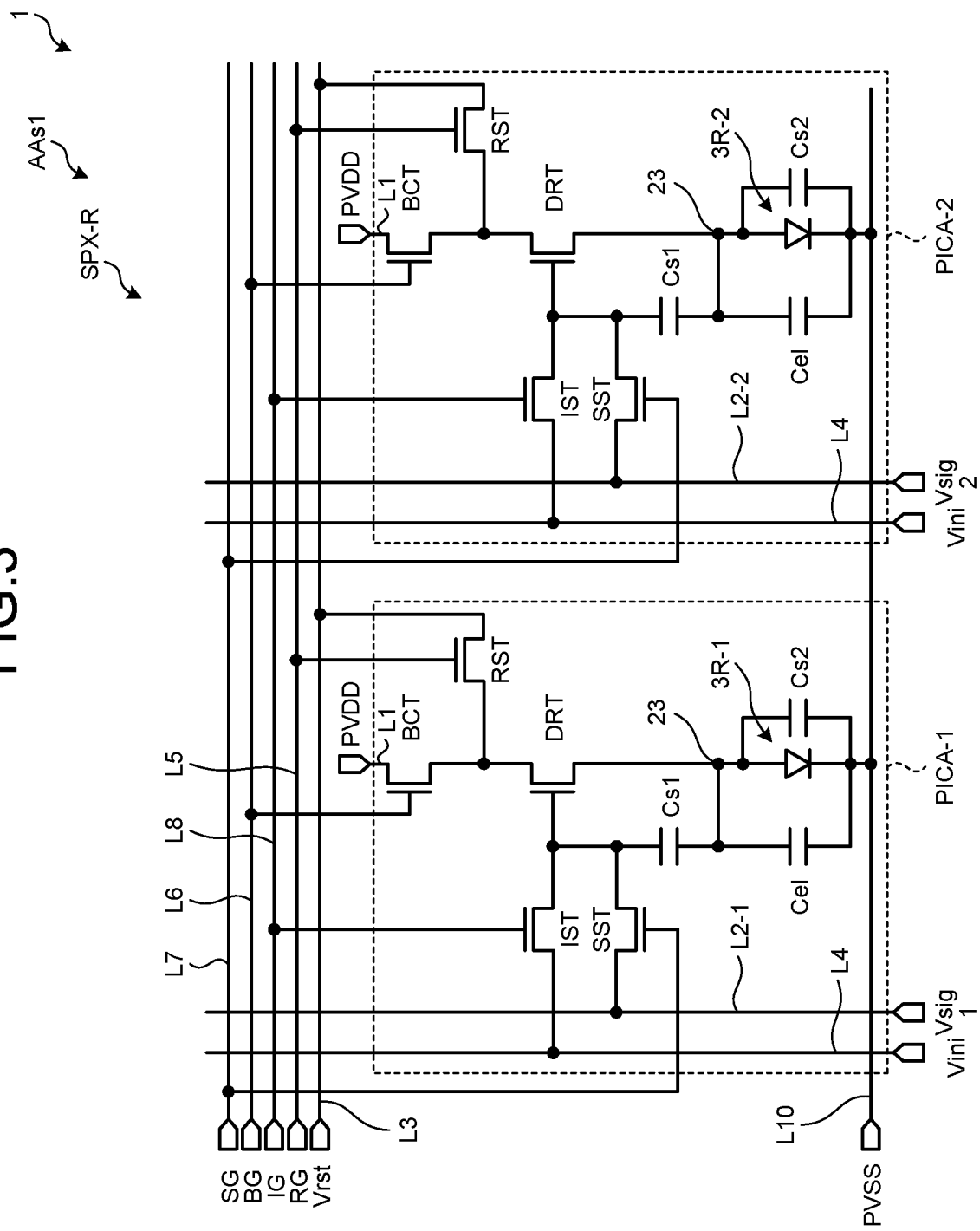
FIG. 3 is a circuit diagram of a pixel circuit.

FIG. 3 is a circuit diagram of a pixel circuit. FIG. 3 illustrates the pixel circuits PICA provided to one sub-pixel SPX-R, and the pixel circuits PICA are provided to the respective mounting electrodes 24 included in the sub-pixel SPX. A first pixel circuit PICA-1 is provided corresponding to the first light-emitting element 3R-1. A second pixel circuit PICA-2 is provided corresponding to the second light-emitting element 3R-2. Although not illustrated in FIG. 3, the pixel circuit PICA having the same configuration is also provided to the mounting electrode 24S not provided with the light-emitting element 3. The first pixel circuit PICA-1 and the second pixel circuit PICA-2 are adjacently provided and share part of wiring. In the following description, the first pixel circuit PICA-1 is explained. The explanation of the first pixel circuit PICA-1 is also applicable to other pixel circuits PICA.

As illustrated in FIG. 3, the first pixel circuit PICA-1 includes the first light-emitting element 3R-1, five transistors, and three capacitances. Specifically, the first pixel circuit PICA-1 includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The first pixel circuit PICA-1 includes first capacitance Cs1 and second capacitance Cs2. Third capacitance Ce1 is capacitance formed between the anode and the cathode of the first light-emitting element 3R-1.

The cathode (cathode electrode 32) of the first light-emitting element 3R-1 is coupled to a cathode power supply line L10. The anode (anode electrode 33) of the first light-emitting element 3R-1 is supplied with an anode power supply potential PVDD via an anode coupling electrode 23, the drive transistor DRT, and the output transistor BCT. An anode power supply line L1 is supplied with the anode power supply potential PVDD. The cathode power supply line L10 is supplied with a cathode power supply potential PVSS via the cathode wiring 60 and the cathode electrode 32. The anode power supply potential PVDD is higher than the cathode power supply potential PVSS.

Ideally, the first light-emitting element 3R-1 emits light by being supplied with a forward current (drive current) due to the potential difference between the anode power supply potential PVDD and the cathode power supply potential PVSS (PVDD-PVSS). In other words, the anode power supply potential PVDD has a potential difference for causing the first light-emitting element 3R-1 to emit light with respect to the cathode power supply potential PVSS. The anode electrode 33 of the first light-emitting element 3R-1 is electrically coupled to the anode coupling electrode 23, and the second capacitance Cs2 is formed between the anode coupling electrode 23 and the cathode power supply line L10.

The source electrode of the drive transistor DRT is coupled to the anode electrode 33 of the first light-emitting element 3R-1 via the anode coupling electrode 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with output control signals BG. The drain electrode of the output transistor BCT is coupled to the anode power supply potential PVDD via the anode power supply line L1.

The source electrode of the initialization transistor IST is coupled to the initialization power supply line L4. The initialization power supply line L4 is supplied with an initialization potential Vini. The gate electrode of the initialization transistor IST is coupled to the initialization control signal line L8. The initialization control signal line L8 is supplied with initialization control signals IG. In other words, when the initialization transistor IST is turned on, the gate electrode of the drive transistor DRT is coupled to the initialization power supply line L4 via the initialization transistor IST.

The source electrode of the pixel selection transistor SST is coupled to a video signal line L2-1. The video signal line L2-1 is supplied with video signals Vsig1. The gate electrode of the pixel selection transistor SST is coupled to the pixel control signal line L7. The pixel control signal line L7 is supplied with pixel control signals SG.

The source electrode of the reset transistor RST is coupled to the reset power supply line L3. The reset power supply line L3 is supplied with a reset power supply potential Vrst. The gate electrode of the reset transistor RST is coupled to the reset control signal line L5. The reset control signal line L5 is supplied with reset control signals RG. The drain electrode of the reset transistor RST is coupled between the source and the drain of the drive transistor DRT and the output transistor BCT. A reset operation performed by the reset transistor RST resets the voltage held in the first capacitance Cs1 and the second capacitance Cs2 via the drive transistor DRT.

The first capacitance Cs1 is formed between the gate electrode of the drive transistor DRT and the anode coupling electrode 23. With the first capacitance Cs1 and the second capacitance Cs2, the pixel circuit PICA can suppress fluctuations in the gate voltage due to parasitic capacitance and leakage current in the drive transistor DRT.

In the following description, the video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig1 (or a gradation signal). In other words, the drive transistor DRT supplies an electric current corresponding to the video signal Vsig1 to the first light-emitting element 3R-1 based on the anode power supply potential PVDD supplied via the output transistor BCT.

The first pixel circuit PICA-1 and the second pixel circuit PICA-2 have similar configurations. The reset power supply line L3, the reset control signal line L5, the output control signal line L6, the pixel control signal line L7, the initialization control signal line L8, and the cathode power supply line L10 are coupled to the first pixel circuit PICA-1 and the second pixel circuit PICA-2.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video signals Vsig1 and Vsig2) to the sub-pixels SPX of the selected pixel row, thereby causing the light-emitting elements 3 (the first light-emitting elements 3-1 and the second light-emitting elements 3-2) to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

With this configuration, the display device 1 according to the embodiment can drive the first pixel circuits PICA-1 and the second pixel circuits PICA-2 corresponding to the first light-emitting elements 3-1 and the second light-emitting elements 3-2, respectively, in the pixel PX in the first region AAs1. Alternatively, the first pixel circuits PICA-1 and the second pixel circuits PICA-2 control the lighting states of the first light-emitting elements 3-1 and the second light-emitting elements 3-2, respectively, thereby suppressing color unevenness (emission wavelength variation) between the pixels PX.

In the mounting electrode 24S not provided with the light-emitting element 3 in the first region AAs1, the light-emitting element 3 of the pixel circuit PICA illustrated in FIG. 3 is not provided, and the anode coupling electrode 23 and the cathode power supply line L10 are not coupled. In the second region AAs2 and the third region AAs3, the light-emitting element 3 (the third light-emitting element 3-3 or the fourth light-emitting element 3-4) is mounted on one of the first pixel circuit PICA-1 and the second pixel circuit PICA-2 and is not mounted on the other.

Figure 4:
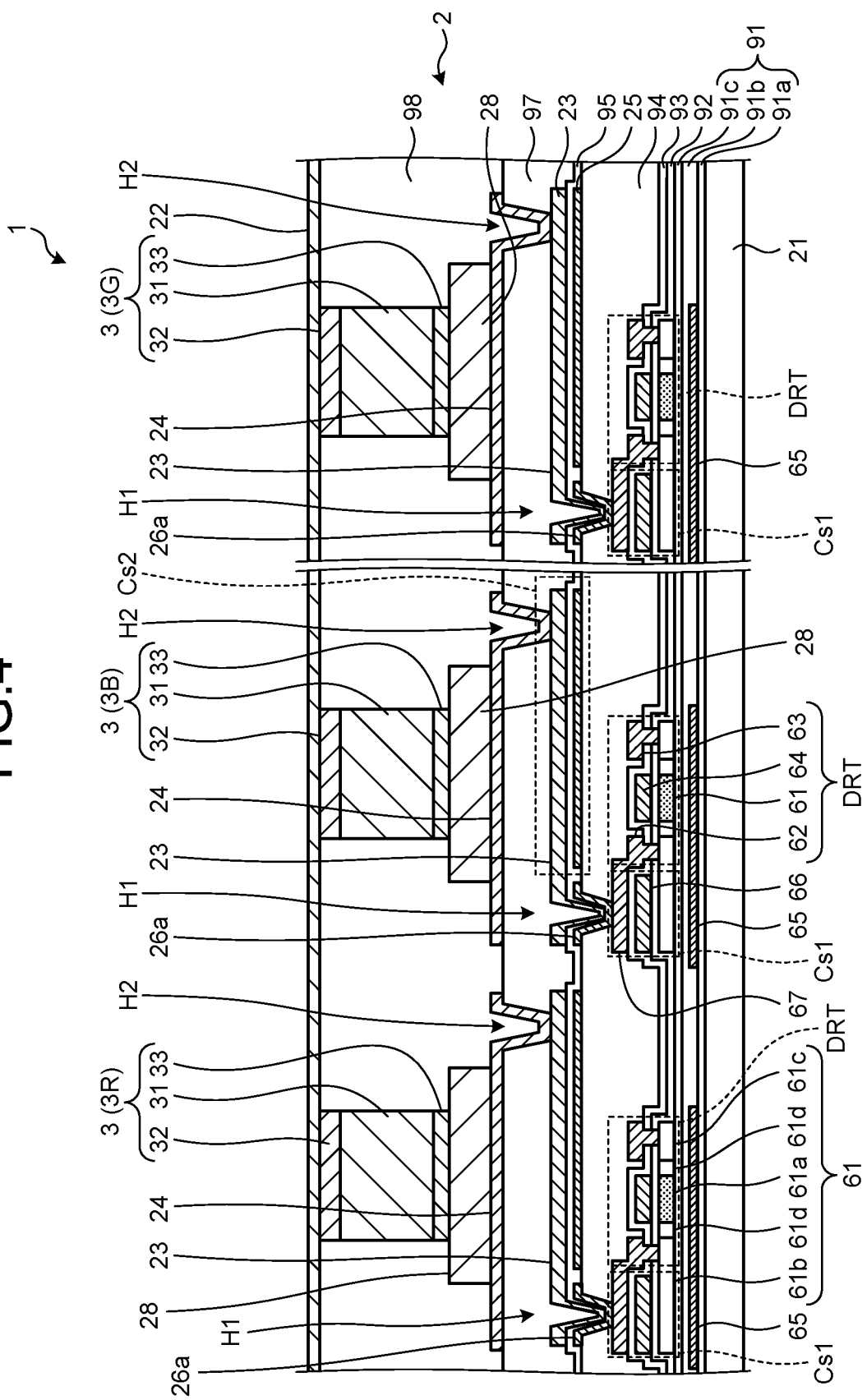
FIG. 4 is a sectional view along line IV-IV' of FIG. 2.

The following describes a sectional configuration of the display device 1. FIG. 4 is a sectional view along line IV-IV' of FIG. 2. As illustrated in FIG. 4, the light-emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light-emitting element 3 in a direction perpendicular to the surface of the substrate 21 is referred to as an "upper side" or simply as "top". A direction from the light-emitting element 3 toward the substrate 21 is referred to as a "lower side" or simply as "bottom".

An undercoat film 91 is provided on the substrate 21. The undercoat film 91 has a three-layered structure of insulating films 91a, 91b, and 91c, for example. The insulating film 91a is a silicon oxide film, the insulating film 91b is a silicon nitride film, and the insulating film 91c is a silicon oxide film.

The configuration of the undercoat film 91 is not limited to that illustrated in FIG. 4. The undercoat film 91, for example, may be a single- or two-layered film or a four-or-more-layered film. If the substrate 21 is a glass substrate, a silicon nitride film may be directly formed on the substrate 21 because silicon nitride films have relatively good adhesion.

A light-blocking film 65 is provided on the insulating film 91a. The light-blocking film 65 is provided between a semiconductor layer 61 and the substrate 21. The light-blocking film 65 can prevent light from entering from the substrate 21 into a channel region 61a of the semiconductor layer 61. Alternatively, the light-blocking film 65 may be made of conductive material and supplied with a predetermined potential to provide a back-gate effect to the drive transistor DRT. The light-blocking film 65 may be provided on the substrate 21, and the insulating film 91a may be provided to cover the light-blocking film 65.

The drive transistor DRT is provided on the undercoat film 91 on a main surface side of the substrate 21. While one drive transistor DRT is provided corresponding to the light-emitting element 3 in FIG. 4, the output transistor BCT, the initialization transistor IST, the pixel selection transistor SST, and the reset transistor RST (refer to FIG. 3) included in the pixel circuit PICA have the same multilayered structure as that of the drive transistor DRT.

The semiconductor layer 61 is provided on the undercoat film 91. The semiconductor layer 61 has a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. A gate electrode 64 is provided on the gate insulating film 92. First wiring 66 is provided in the same layer as that of the gate electrode 64. The gate electrode 64 and the first wiring 66 are made of molybdenum-tungsten (MoW), for example.

In the example illustrated in FIG. 4, the drive transistor DRT has a top-gate structure in which the gate electrode 64 is provided on the semiconductor layer 61. The structure is not limited thereto, and the drive transistor DRT may have a bottom-gate structure in which the gate electrode 64 is provided under the semiconductor layer 61 or a dual-gate structure in which the gate electrodes 64 are provided both on and under the semiconductor layer 61.

An interlayer insulating film 93 is provided on the gate insulating film 92 to cover the gate electrode 64. The interlayer insulating film 93 has a multilayered structure composed of a silicon nitride film and a silicon oxide film, for example. A source electrode 62 and a drain electrode 63 are provided on the interlayer insulating film 93. The source electrode 62 is electrically coupled to the source region 61b through a contact hole formed in the gate insulating film 92 and the interlayer insulating film 93. The drain electrode 63 is electrically coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is formed in a region overlapping the first wiring 66. The first capacitance Cs1 is formed by the first wiring 66 and the second wiring 67 facing each other with the interlayer insulating film 93 interposed therebetween. The first wiring 66 is formed in a region overlapping part of the semiconductor layer 61. The first capacitance Cs1 includes capacitance formed by the semiconductor layer 61 and the first wiring 66 facing each other with the gate insulating film 92 interposed therebetween.

A first organic insulating film 94 is provided on the interlayer insulating film 93 to cover the drive transistor DRT and the second wiring 67. The first organic insulating film 94 is made of organic material, such as photosensitive acrylic. The organic material, such as photosensitive acrylic, is excellent in coverability for covering a difference in level of wiring and flatness on the surface compared with inorganic insulating material formed by chemical vapor deposition (CVD), for example.

A counter electrode 25, a capacitance insulating film 95, and the anode coupling electrode 23 are stacked in this order on the first organic insulating film 94. The counter electrode 25 is made of translucent conductive material, such as indium tin oxide (ITO). Although not illustrated in FIG. 4, the counter electrode 25 is coupled to the anode power supply line L1 (refer to FIG. 3) at the bottom of a contact hole formed in the first organic insulating film 94. A coupling electrode 26a is provided in the same layer as that of the counter electrode 25. The coupling electrode 26a is provided to cover the inside of a contact hole H1 formed in the first organic insulating film 94 and is coupled to the second wiring 67 at the bottom of the contact hole H1.

The capacitance insulating film 95 is provided to cover the counter electrode 25 and the coupling electrode 26a and has an opening in the region overlapping the contact hole H1. The capacitance insulating film 95 is a silicon nitride film, for example. The anode coupling electrode 23 faces the counter electrode 25 with the capacitance insulating film 95 interposed therebetween. The anode coupling electrode 23 is electrically coupled to the coupling electrode 26a and the second wiring 67 through the contact hole H1. As a result, the anode coupling electrode 23 is electrically coupled to the drive transistor DRT.

The anode coupling electrode 23 has a multilayered structure of titanium (Ti) and aluminum (Al), for example. The structure is not limited thereto, and the anode coupling electrode 23 may be made of material including at least one of metals of molybdenum (Mo) and Ti. Alternatively, the anode coupling electrode 23 may be made of alloy including at least one of Mo and Ti or translucent conductive material. The second capacitance Cs2 is formed between the anode coupling electrode 23 and the counter electrode 25 facing each other with the capacitance insulating film 95 interposed therebetween.

A second organic insulating film 97 is provided on the anode coupling electrode 23. The second organic insulating film 97 is made of the same material as that of the first organic insulating film 94. The mounting electrode 24 is provided on the second organic insulating film 97 and is electrically coupled to the anode coupling electrode 23 through a contact hole H2 The mounting electrode 24 has a multilayered structure of Ti and Al like the anode coupling electrode 23. The mounting electrode 24 may be made of conductive material different from that of the anode coupling electrode 23. The second organic insulating film 97 may be made of material different from that of the first organic insulating film 94.

The light-emitting elements 3R, 3G, and 3B are mounted on the respective mounting electrodes 24. Each light-emitting element 3 is mounted with the anode electrode 33 in contact with the mounting electrode 24. A bonding member 28 between the anode electrode 33 of the light-emitting element 3 and the mounting electrode 24 may be made of any desired material as long as it can secure satisfactory continuity between them and does not damage the objects formed on the array substrate 2. The bonding member 28 is made of solder or conductive paste, for example. Examples of the method for bonding the anode electrode 33 and the mounting electrode 24 include, but are not limited to, a reflowing process using low-temperature melting soldering material, a method of placing the light-emitting element 3 on the array substrate 2 with conductive paste interposed therebetween and sintering them, etc.

The light-emitting element 3 includes a semiconductor layer 31, the cathode electrode 32, and the anode electrode 33. The semiconductor layer 31 may have a configuration in which an n-type cladding layer, an active layer, and a p-type cladding layer are stacked. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the light-emitting elements 3R, 3G, and 3B. The active layer may have a multi-quantum well structure (MQW structure) in which well layers and barrier layers composed of several atomic layers are cyclically stacked for high efficiency.

An element insulating film 98 is provided between the light-emitting elements 3. The element insulating film 98 is made of resin material. The element insulating film 98 covers at least the side surfaces of the light-emitting elements 3, and the cathode electrodes 32 of the light-emitting elements 3 are exposed from the element insulating film 98. The element insulating film 98 is formed flat such that the upper surface of the element insulating film 98 and the upper surfaces of the cathode electrodes 32 form the same plane. The position of the upper surface of the element insulating film 98 may be different from that of the upper surfaces of the cathode electrodes 32.

The counter cathode electrode 22 covers the light-emitting elements 3 and the element insulating film 98 and is electrically coupled to the light-emitting elements 3. The counter cathode electrode 22 is made of translucent conductive material, such as ITO. This configuration can efficiently extract light output from the light-emitting elements 3 to the outside. The counter cathode electrode 22 is electrically coupled to the cathode electrodes 32 of the light-emitting elements 3 mounted on the display region AA. The counter cathode electrode 22 is coupled to the cathode wiring 60 (refer to FIG. 1) provided on the array substrate 2 at a contact part provided outside the display region AA.

As described above, the display device 1 including the light-emitting elements 3 as the display elements is configured. The display device 1 may include an overcoat layer and/or a cover substrate on the counter cathode electrode 22 as necessary. The display device 1 may further include a circularly polarizing plate, a touch panel, and other components on the counter cathode electrode 22.

FIG. 4 illustrates a face-up structure in which the light-emitting element 3 is coupled to the counter cathode electrode 22 at the upper part. The structure is not limited thereto, and the light-emitting element 3 may be a flip-chip light-emitting element in which the anode electrode 33 (p-type electrode) and the cathode electrode 32 (n-type electrode) are provided on the same surface facing the array substrate 2.

Figure 6:
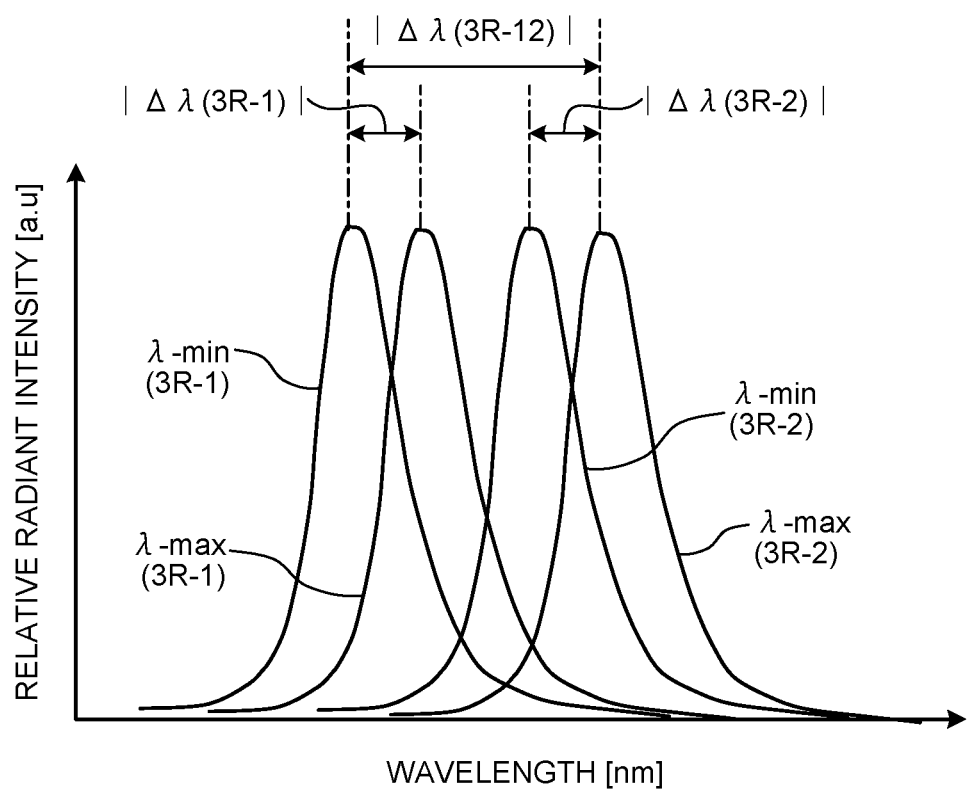
FIG. 6 is a graph schematically illustrating the relation between relative radiant intensity of light and wavelength of the first light-emitting element and the second light-emitting element.

The following describes the characteristics (peak emission wavelength and emission wavelength variation) of the light-emitting elements 3 in each region. FIG. 5 is a table indicating the wavelength variation of the first light-emitting elements and the second light-emitting elements. FIG. 6 is a graph schematically illustrating the relation between relative radiant intensity of light and wavelength of the first light-emitting element and the second light-emitting element. FIG. 6 illustrates the relative radiant intensity of light of the first light-emitting element 3R-1 and the second light-emitting element 3R-2 out of the light-emitting elements 3R, 3G, and 3B.

As illustrated in FIGS. 5 and 6, the first light-emitting elements 3-1 and the second light-emitting elements 3-2 in the first region AAs1 have different peak emission wavelengths. The peak emission wavelength is the wavelength at which the radiant intensity of light of the light-emitting element 3 shows the maximum value. The emission wavelength variation indicates the difference between the maximum value (A-max) and the minimum value (A-min) of the peak emission wavelengths of the light-emitting elements 3 and may be referred to as "difference in peak emission wavelength".

As illustrated in FIG. 6, the peak emission wavelength of the first light-emitting element 3R-1 is different from that of the second light-emitting element 3R-2. In the example illustrated in FIG. 6, the peak emission wavelength of the second light-emitting element 3R-2 is longer than that of the first light-emitting element 3R-1. The emission wavelength variation of the first light-emitting elements 3R-1 falls within the range indicated by $|\Delta\lambda(3R-1)|$. The emission wavelength variation of the second light-emitting elements 3R-2 falls within the range indicated by $|\Delta\lambda(3R-2)|$. The emission wavelength variation of the first light-emitting elements 3R-1 is equivalent to that of the second light-emitting elements 3R-2.

As indicated by Table 1 in FIG. 5, both the emission wavelength variation of the first light-emitting elements 3R-1 ($|\Delta\lambda(3R-1)|$) and that of the second light-emitting elements 3R-2 ($|\Delta\lambda(3R-2)|$) are 2.5 nm or smaller. The emission wavelength variation including the first light-emitting elements 3R-1 and the second light-emitting elements 3R-2 ($|\Delta\lambda(3R-12)|$) is 3.5 nm or smaller.

As illustrated in FIG. 5, the light-emitting elements 3G (the first light-emitting element 3G-1 and the second light-emitting element 3G-2) that output green light and the light-emitting elements 3B (the first light-emitting element 3B-1 and the second light-emitting element 3B-2) that output blue light also have similar relations of the emission wavelength variation. Specifically, both the emission wavelength variation of the first light-emitting elements 3G-1 ($|\Delta\lambda(3G-1)|$) and that of the second light-emitting elements 3G-2 ($|\Delta\lambda(3G-2)|$) are 2.0 nm or smaller. The emission wavelength variation including the first light-emitting elements 3G-1 and the second light-emitting elements 3G-2 ($|\Delta\lambda(3G-12)|$) is 3.0 nm or smaller.

Both the emission wavelength variation of the first light-emitting elements 3B-1 ($|\Delta\lambda(3B-1)|$) and that of the second light-emitting elements 3B-2 ($|\Delta\lambda(3B-2)|$) are 3.5 nm or smaller. The emission wavelength variation including the first light-emitting elements 3B-1 and the second light-emitting elements 3B-2 ($|\Delta\lambda(3B-12)|$) is 5.0 nm or smaller.

In the first region AAs1, elements satisfying the peak emission wavelength and the emission wavelength variation described above are selected as the first light-emitting elements 3-1 and the second light-emitting elements 3-2 and are mounted on each pixel PX (sub-pixel SPX). Therefore, the present embodiment can reduce the emission wavelength variation of the pixels PX in the first region AAs1. In addition, the present embodiment can change the way of driving the first light-emitting elements 3-1 and the second light-emitting elements 3-2 so as to reduce display variation (color unevenness) in the first region AAs1 based on information, such as luminance and chromaticity of the elements in each gradation.

When compared by RGB, the emission wavelength variation of the first light-emitting elements 3R-1 and the second light-emitting elements 3R-2 that emit red light is larger than that of the first light-emitting elements 3G-1 and the second light-emitting elements 3G-2 that emit green light. The emission wavelength variation of the first light-emitting elements 3B-1 and the second light-emitting elements 3B-2 that emit blue light is larger than that of the first light-emitting elements 3R-1 and the second light-emitting elements 3R-2 that emit red light.

As described above, the present embodiment can set the range of the emission wavelength variation for each of RGB depending on the sensitivity of the human eye at each wavelength.

FIG. 7 is a table indicating the wavelength variation of the light-emitting elements among the first region, the second region, and the third region. The third light-emitting elements 3-3 in the second region AAs2 and the fourth light-emitting elements 3-4 in the third region AAs3 have characteristics of the emission wavelength variation not included in the emission wavelength variations of the first light-emitting elements 3-1 and the second light-emitting elements 3-2 described above. In other words, elements having the emission wavelength variation larger than that of the first light-emitting elements 3-1 and the second light-emitting elements 3-2 in the first region AAs1 are selected as the third light-emitting elements 3-3 in the second region AAs2 and the fourth light-emitting elements 3-4 in the third region AAs3.

As illustrated in FIG. 7, the emission wavelength variation of the first light-emitting elements 3R-1 and the second light-emitting elements 3R-2 in the first region AAs1 and the third light-emitting elements 3R-3 in the second region AAs2 ($|\Delta\lambda(3R-13)|$) is 3.0 nm or smaller. The emission wavelength variation of the third light-emitting elements 3R-3 in the second region AAs2 and the fourth light-emitting elements 3R-4 in the third region AAs3 ($|\Delta\lambda(3R-34)|$) is 3.0 nm or smaller. The emission wavelength variation of the first light-emitting elements 3R-1 and the second light-emitting elements 3R-2 in the first region AAs1 and the fourth light-emitting elements 3R-4 in the third region AAs3 ($|\Delta\lambda(3R-14)|$) is 3.5 nm or smaller.

As illustrated in FIG. 7, the light-emitting elements 3G that output green light and the light-emitting elements 3B that output blue light also have similar relations of the emission wavelength variation between the regions. The emission wavelength variation of the first light-emitting elements 3G-1 and the second light-emitting elements 3G-2 in the first region AAs1 and the third light-emitting elements 3G-3 in the second region AAs2 ($|\Delta\lambda(3G-13)|$) is 2.5 nm or smaller. The emission wavelength variation of the third light-emitting elements 3G-3 in the second region AAs2 and the fourth light-emitting elements 3G-4 in the third region AAs3 ($|\Delta\lambda(3G-34)|$) is 2.5 nm or smaller. The emission wavelength variation of the first light-emitting elements 3G-1 and the second light-emitting elements 3G-2 in the first region AAs1 and the fourth light-emitting elements 3G-4 in the third region AAs3 ($|\Delta\lambda(3G-14)|$) is 3.0 nm or smaller.

The emission wavelength variation of the first light-emitting elements 3B-1 and the second light-emitting elements 3B-2 in the first region AAs1 and the third light-emitting elements 3B-3 in the second region AAs2 ($|\Delta\lambda(3B-13)|$) is 4.0 nm or smaller. The emission wavelength variation of the third light-emitting elements 3B-3 in the second region AAs2 and the fourth light-emitting elements 3B-4 in the third region AAs3 ($|\Delta\lambda(3B-34)|$) is 4.0 nm or smaller. The emission wavelength variation of the first light-emitting elements 3B-1 and the second light-emitting elements 3B-2 in the first region AAs1 and the fourth light-emitting elements 3B-4 in the third region AAs3 ($|\Delta\lambda(3B-14)|$) is 5.0 nm or smaller.

As described above, the display device 1 according to the present embodiment has smaller emission wavelength variation of the light-emitting elements 3 in the first region AAs1 positioned at the center of the observer's field of view than in the second region AAs2 and the third region AAs3 closer to the outer end. Therefore, the display device 1 can suppress color unevenness between the pixels PX in the first region AAs1 and achieve satisfactory display characteristics.

In other words, the display device 1 according to the present embodiment has redundancy in the arrangement density and the emission wavelength variation of the light-emitting elements 3 in the second region AAs2 and the third region AAs3 closer to the outer end. By mounting the light-emitting elements 3 with desired characteristics on the mounting electrodes 24S not provided with the light-emitting element 3 in the second region AAs2 and the third region AAs3, the present embodiment can support various display characteristics. The present embodiment, for example, enables customization such that part of the second region AAs2 and the third region AAs3 has the display characteristics equivalent to those in the first region AAs1. Alternatively, the present embodiment may cause the output direction of the light-emitting elements 3 to differ between the first region AAs1, the second region AAs2, and the third region AAs3. The present embodiment, for example, may set the viewing angle narrow in the first region AAs1 and set it wider in the second region AAs2 and the third region AAs3 in this order.

FIG. 8 is a view for explaining a method for repairing the display device according to the embodiment. As illustrated in FIG. 8, a lighting inspection is performed after the light-emitting elements 3 are mounted on the mounting electrodes 24. If there is a light-emitting element 3 with a lighting failure, another light-emitting element 3 is mounted on the mounting electrode 24S disposed adjacently to the light-emitting element 3 with a lighting failure. In FIG. 8, the light-emitting elements 3 with a lighting failure are represented by a cross (X).

If the third light-emitting element 3B-3 of the sub-pixel SPX-B has a lighting failure in the second region AAs2, for example, another third light-emitting element 3B-3 is mounted on the mounting electrode 24S disposed adjacently to the third light-emitting element 3B-3 with a lighting failure in the second direction Dy.

As described above, the pixels PX in the regions of the display device 1 according to the present embodiment each include the mounting electrodes 24S not provided with the light-emitting element 3 as the mounting electrodes 24S for repair. In particular, the second region AAs2 and the third region AAs3 closer to the outer end have lower arrangement density of the light-emitting elements 3 and are provided with more mounting electrodes 24S not provided with the light-emitting element 3 than the first region AAs1. Therefore, the present embodiment has greater flexibility in mounting the light-emitting elements 3 for repair and can facilitate repair of the light-emitting elements 3.

If the pixel circuits PICA are coupled to the respective mounting electrodes 24S not provided with the light-emitting element 3, the present embodiment can drive the light-emitting element 3 for repair only by mounting it on the mounting electrode 24S. The present embodiment is not limited thereto. Let us assume a case where the pixel circuits PICA are not coupled in advance to the respective mounting electrodes 24S not provided with the light-emitting element 3, that is, a case where there is no pixel circuit PICA corresponding to the mounting electrodes 24S not provided with the light-emitting element 3, and the mounting electrodes 24S are insularly provided on the second organic insulating film 97 in a floating state. In this case, the present embodiment can drive the light-emitting element 3 for repair by forming wiring that couples the mounting electrode 24S provided with the light-emitting element 3 for repair and the pixel circuit PICA. As illustrated in FIG. 8, for example, repair is performed such that the mounting electrode 24 of the light-emitting element 3 (X) having a lighting failure is coupled to the mounting electrode 24S provided with the light-emitting element 3 for repair by metallized wiring or the like.

Figure 9:
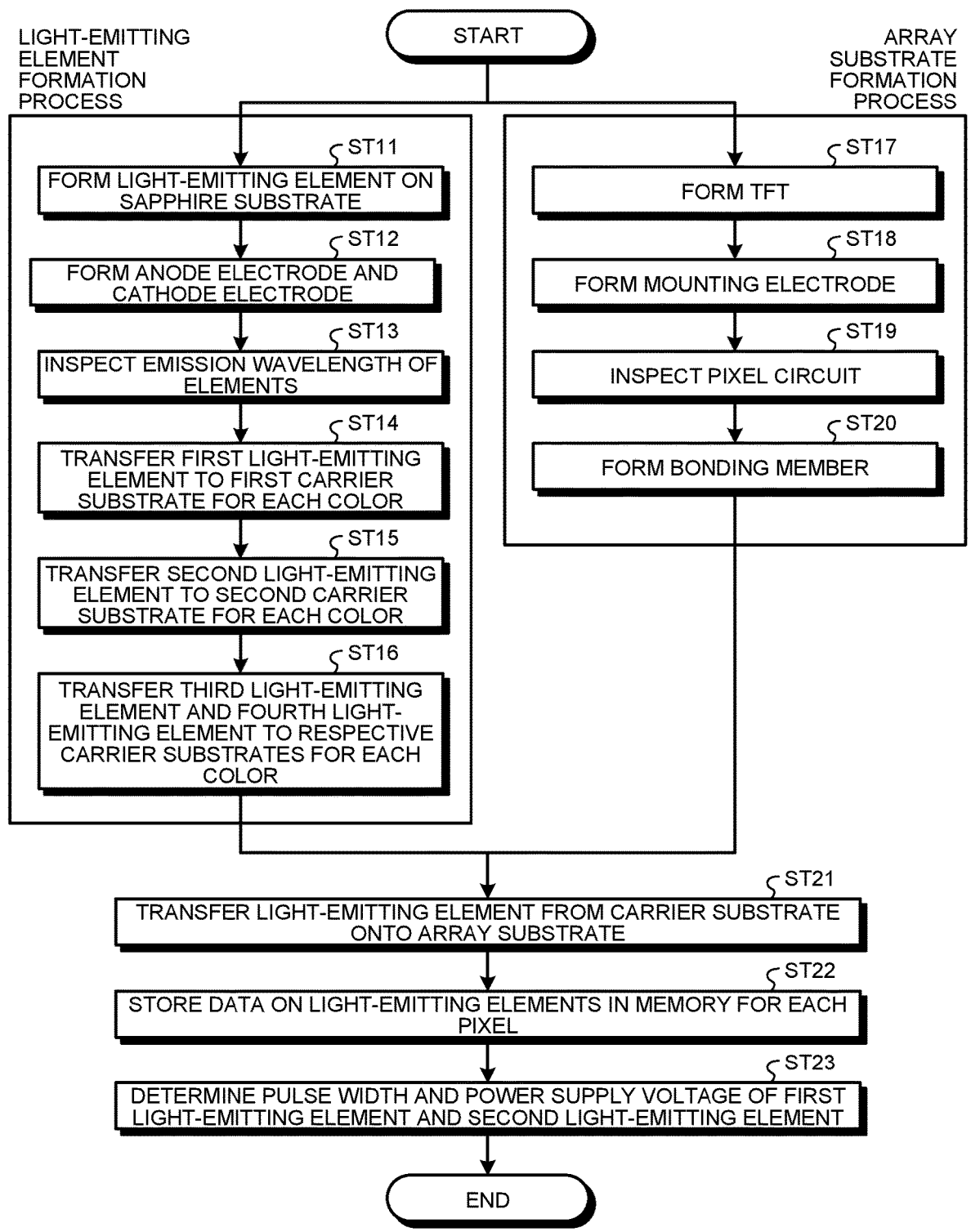
FIG. 9 is a flowchart for explaining a method for manufacturing the display device according to the embodiment.

FIG. 9 is a flowchart for explaining a method for manufacturing the display device according to the embodiment. As illustrated in FIG. 9, the method for manufacturing the display device includes a light-emitting element formation process (Steps ST11 to ST16) and an array substrate formation process (Steps ST17 to ST20).

In the light-emitting element formation process, a manufacturing apparatus forms the semiconductor layer 31 on a sapphire substrate (Step ST11). Specifically, the manufacturing apparatus forms a high-resistance layer, an n-type cladding layer, an active layer, and a p-type cladding layer (not illustrated) in this order on one surface of the sapphire substrate.

Subsequently, the manufacturing apparatus forms the anode electrodes 33 and the cathode electrodes 32 having different polarities (Step ST12). To manufacture flip-chip light-emitting elements 3, the manufacturing apparatus forms the anode electrodes 33 and the cathode electrodes 32 in the same process (at Step ST12). By contrast, to manufacture the light-emitting elements 3 having a face-up structure illustrated in FIG. 4, the manufacturing apparatus may form one (e.g., the anode electrodes 33) of the anode electrodes 33 and the cathode electrodes 32 first and then form the other (e.g., the cathode electrodes 32) after transferring the light-emitting elements 3 to carrier substrates or mounting them on the array substrate 2.

Subsequently, an inspection device inspects the emission wavelength of the light-emitting elements 3 (Step ST13). The inspection device acquires information on the crystallinity of the active layer and the emission wavelength of the light-emitting elements 3 by photoluminescence (PL) or electroluminescence (EL) inspection, for example. The inspection device maps the acquired various pieces of information on the light-emitting elements 3.

Based on the various pieces of information on the light-emitting elements 3, the manufacturing apparatus ranks the first light-emitting elements 3-1, the second light-emitting elements 3-2, the third light-emitting elements 3-3, and the fourth light-emitting elements 3-4 according to the characteristics of the peak emission wavelength and the emission wavelength variation in the regions. The light-emitting elements 3 do not fall under any of these categories are removed as defective chips.

Subsequently, the manufacturing apparatus transfers the light-emitting elements 3 on the sapphire substrate to the carrier substrate by laser lift-off or other methods. Specifically, the manufacturing apparatus transfers the first light-emitting elements 3-1 to a first carrier substrate for each color (RGB) (Step ST14). The manufacturing apparatus transfers the second light-emitting elements 3-2 to a second carrier substrate for each color (RGB) (Step ST15). The manufacturing apparatus transfers the third light-emitting elements 3-3 and the fourth light-emitting elements 3-4 to respective carrier substrates for each color (RGB) (Step ST16).

In the array substrate formation process, the manufacturing apparatus first forms the transistors, such as the drive transistor DRT, and the wiring on the substrate 21 (Step ST17).

Subsequently, the manufacturing apparatus forms the mounting electrodes 24 and the mounting electrodes 24S on the array substrate 2 (Step ST18).

Subsequently, the inspection device inspects the pixel circuits PICA formed on the array substrate 2 (Step ST19). At Step ST19, the inspection device inspects the operations of the transistors of the pixel circuits PICA and whether there is a short circuit between the pixels PX, for example. If there is a defective pixel circuit PICA, the manufacturing apparatus performs repair of the pixel circuit PICA. Alternatively, the manufacturing apparatus may store therein the positions of the defective pixel circuit PICA and the mounting electrode 24 and mount the light-emitting element 3 on another mounting electrode 24S for repair instead of the defective pixel circuit PICA and the mounting electrode 24 in a process of transferring the light-emitting elements 3, which will be described later. The inspection process for the pixel circuits PICA may be performed in the same process as the inspection process for the light-emitting elements 3 described above.

Subsequently, the manufacturing apparatus forms the bonding members 28 on the respective mounting electrodes 24 and 24S provided on the array substrate 2 (Step ST20).

The manufacturing apparatus places the carrier substrates provided with the light-emitting elements 3 and the array substrate 2 provided with the mounting electrodes 24 and 24S and the bonding members 28 in a manner facing each other, applies pressure to them, and transfers the light-emitting elements 3 from the carrier substrates to the array substrate 2 (Step ST21). At this time, the first light-emitting elements 3-1, the second light-emitting elements 3-2, and the third light-emitting elements 3-3 and the fourth light-emitting elements 3-4 formed at Steps ST14, ST15, and ST16, respectively, are transferred to the array substrate 2 corresponding to the respective regions.

The drive IC 210 (refer to FIG. 1) stores data on the light-emitting elements 3 for each pixel PX in a memory (Step ST22). The data on the light-emitting elements 3 are stored in such a manner that the characteristics of the light-emitting elements 3 acquired at Step ST13 are associated with the positional information on the light-emitting elements 3 transferred at Step ST21.

The drive IC 210 (refer to FIG. 1) determines the pulse width and the power supply voltage of the drive signals to be supplied to the first light-emitting elements 3-1 and the second light-emitting elements 3-2 based on the information acquired at Step ST22 (Step ST23). Therefore, the first light-emitting elements 3-1 and the second light-emitting elements 3-2 are driven such that the display characteristics (peak emission wavelengths) of the pixels PX in the first region AAs1 are uniformized. Consequently, the display device 1 can suppress color unevenness or the like in the first region AAs1 corresponding to the center of the field of view, thereby achieving satisfactory display characteristics.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modification thereof.

What is claimed is:

1. A display device comprising:
   a substrate;
   a plurality of pixels provided to the substrate;
   a plurality of mounting electrodes and a plurality of light-emitting elements provided to the pixels;
   a first region provided at a center part of a display region of the substrate; and
   a second region provided closer to an outer end of the substrate than the first region in the display region of the substrate, wherein
   a number of the mounting electrodes included in each of the pixels in the first region is equal to a number of the mounting electrodes included in each of the pixels in the second region, and
   a number of the light-emitting elements included in each of the pixels in the first region is larger than a number of the light-emitting elements included in each of the pixels in the second region.

2. The display device according to claim 1, wherein the number of the mounting electrodes included in each of the pixels in the first region and the second region is larger than the number of the light-emitting elements.

3. The display device according to claim 1, wherein the mounting electrodes are arrayed in a matrix (row-column configuration) in each of the pixels.

4. The display device according to claim 1, wherein
   in the pixels adjacently disposed in the first region, one mounting electrode not provided with the light-emitting element is disposed between the light-emitting element of one of the pixels and the light-emitting element of the other of the pixels, and
   in the pixels adjacently disposed in the second region, a plurality of mounting electrodes not provided with the light-emitting element are disposed between the light-emitting element of one of the pixels and the light-emitting element of the other of the pixels.

5. The display device according to claim 1, wherein
   each of the pixels in the first region comprises a first light-emitting element and a second light-emitting element configured to output light in the same color as a color of light output from the first light-emitting element and having a peak emission wavelength different from a peak emission wavelength of the first light-emitting element,
   each of the pixels in the second region comprises a third light-emitting element configured to output light in the same color as the color of light output from the first light-emitting element and the second light-emitting element, and
   emission wavelength variation of a plurality of the first light-emitting elements is smaller than emission wavelength variation of a plurality of the third light-emitting elements.

6. The display device according to claim 5, wherein
   the first light-emitting elements are provide corresponding to red, green, and blue,
   emission wavelength variation of the first light-emitting elements in red is larger than emission wavelength variation of the first light-emitting elements in green, and
   emission wavelength variation of the first light-emitting elements in blue is larger than emission wavelength variation of the first light-emitting elements in red.

7. The display device according to claim 5, further comprising:

a third region provided closer to an outer end of the substrate than the first region and the second region, wherein each of the pixels in the third region comprises a fourth light-emitting element configured to output light in the same color as the color of light output from the first light-emitting element and the second light-emitting element, and emission wavelength variation of a plurality of the first light-emitting elements is smaller than emission wavelength variation of a plurality of the fourth light-emitting elements.

8. A display device comprising: a substrate;

a plurality of pixels provided to the substrate;

a first region provided at a center part of a display region of the substrate; and a second region provided closer to an outer end of the substrate than the first region in the display region of the substrate, wherein each of the pixels in the first region comprises a first light-emitting element and a second light-emitting element configured to output light in the same color as a color of light output from the first light-emitting element and having a peak emission wavelength different from a peak emission wavelength of the first light-emitting element, each of the pixels in the second region comprises a third light-emitting element configured to output light in the same color as the color of light output from the first light-emitting element and the second light-emitting element, and emission wavelength variation of a plurality of the first light-emitting elements is smaller than emission wavelength variation of a plurality of the third light-emitting elements.

9. The display device according to claim 8, wherein the first light-emitting elements are provided corresponding to red, green, and blue, emission wavelength variation of the first light-emitting elements in red is larger than emission wavelength variation of the first light-emitting elements in green, and emission wavelength variation of the first light-emitting elements in blue is larger than emission wavelength variation of the first light-emitting elements in red.

10. The display device according to claim 8, further comprising:

a third region provided closer to the outer end of the substrate than the first region and the second region, wherein each of the pixels in the third region comprises a fourth light-emitting element configured to output light in the same color as the color of light output from the first light-emitting element and the second light-emitting element, and emission wavelength variation of a plurality of the first light-emitting elements is smaller than emission wavelength variation of a plurality of the fourth light-emitting elements.

* * * * *